United States Patent [19]

Countryman

[11] Patent Number: 5,150,317
[45] Date of Patent: Sep. 22, 1992

[54] ADAPTIVE DIGITAL FILTER WHICH IS RESPONSIVE TO THE RATE OF CHANGE OF AN INPUT SIGNAL

[75] Inventor: Lauren P. Countryman, Everett, Wash.

[73] Assignee: The Boeing Company, Seattle, Wash.

[21] Appl. No.: 295,858

[22] Filed: Jan. 11, 1989

[51] Int. Cl.$^5$ .............................................. G06F 15/31
[52] U.S. Cl. ................................................. 364/724.01
[58] Field of Search .................... 364/724.01, 724.19, 364/572

[56] References Cited

U.S. PATENT DOCUMENTS

| | | | |
|---|---|---|---|
| 3,177,349 | 4/1965 | Zaborszky et al. | 364/724.19 |
| 3,777,130 | 12/1973 | Croisier et al. | 364/724.16 |
| 3,778,602 | 12/1973 | Schmitt | 364/572 X |
| 3,908,115 | 9/1975 | Waggener | 364/572 X |
| 4,066,878 | 1/1978 | Miller et al. | 364/728.07 X |
| 4,106,102 | 8/1978 | Desblache | 364/724.07 |
| 4,121,287 | 10/1978 | Leal et al. | . |
| 4,590,579 | 5/1986 | Erb | 364/574 |
| 4,654,811 | 3/1987 | Jakubzick | 364/572 |
| 4,674,062 | 6/1987 | Premerlani | 364/724.19 X |
| 4,746,251 | 5/1988 | Yoshikawa et al. | 364/474.3 X |
| 4,796,213 | 1/1989 | Blotenberg | 364/572 |

*Primary Examiner*—Tan V. Mai
*Attorney, Agent, or Firm*—R. H. Sproule

[57] ABSTRACT

The time constant of an adaptive digital filter is regulated as a function of the magnitude of the rate of change of the input signal to the filter. When the input signal has a large step input or it changes rapidly, the time constant is shortened; however when the input signal has a small step input or it changes more slowly, the time constant of the filter is increased.

24 Claims, 3 Drawing Sheets

ADAPTIVE DIGITAL FILTER WHICH IS RESPONSIVE TO THE RATE OF CHANGE OF AN INPUT SIGNAL

TECHNICAL FIELD

The present invention pertains to an adaptive digital filter having a time constant which is adjusted as a function of the rate of change of an input signal.

BACKGROUND OF THE INVENTION

Signals containing noise typically require filtering before they can be used to generate a visual display or to control a physical operation. Sometimes these signals are differentiated to obtain a rate signal. Differentiation typically causes the noise present in the original signal to be accentuated in the rate signal. For example, a noisy signal may generate visual displays which fluctuate excessively or control signals which do not result in a smoothly controlled operation. Even with a noise-free digital signal, step changes in the signal can result in large fluctuations in the rate signal. When the step changes in a digitally encoded signal are comparable in size or larger than the minimum step change of the display or of the motion control, and these changes are unfiltered, the response can be jerky or erratic.

Some modern commercial aircraft utilize digital numerical displays of flight parameters such as cabin altitude and cabin altitude rate. If these signals are not properly filtered before driving a display, a small change in altitude may be displayed initially as a very large change. For example, an unfiltered noisy signal which represents a gradual change in cabin altitude of one hundred feet per minute may initially generate a displayed change in cabin altitude rate of several thousand feet per minute.

These parameters may change slowly or rapidly depending upon the flight of the aircraft. When, for example, cabin altitude is changing at a slow rate, it is desirable to use a filter which has a longer time constant to average the signal over several steps of the input change, thereby achieving a smoothly changing response to the input. However, when cabin altitude is changing at a faster rate, it is desirable to use a filter which has a shorter time constant to permit faster response. When the input is changing faster, the digital step changes occur more frequently so several step changes can be averaged by a shorter time constant.

A prior solution to this problem was to process the input signal using a filter having a fixed time constant. However, to generate a smoothly changing output in response to slowly changing signals, it was necessary to provide a time constant which was significantly longer than the time between changes in the step value. This prevented quick response to inputs having large step changes or inputs which had rapidly changing values.

A number of conventional filters have been disclosed. For example, in U.S. Pat. No. 4,654,811 by Jakubzick there is disclosed an adaptive digital filter having a time constant which is set to a high value when the incoming data changes at a slow rate, and which is set to a low value when the incoming data changes at a faster rate.

SUMMARY OF THE INVENTION

The present invention pertains to a method for filtering a digital signal using at least one filter having a time constant which is variable. The time constant of the filter is a function of the rate of change of the signal entering the filter. Therefore, an object of the present invention is to regulate the filter time constant over a range so that it is at its maximum value during the smallest or slowest changes in the input signal, and so that it is at its minimum value during the largest or fastest changes in the input signal. Various selectable constants are provided to allow the filter characteristics to be optimized for various applications. Filtering the input signals for a period longer than the period between least significant bit changes of the input signal can eliminate perturbations in these signals.

BRIEF DESCRIPTION OF THE DRAWINGS

The present invention will be discussed in greater detail in the following detailed description in conjunction with the attached drawings, in which.

DETAILED DESCRIPTION

Figure 1:
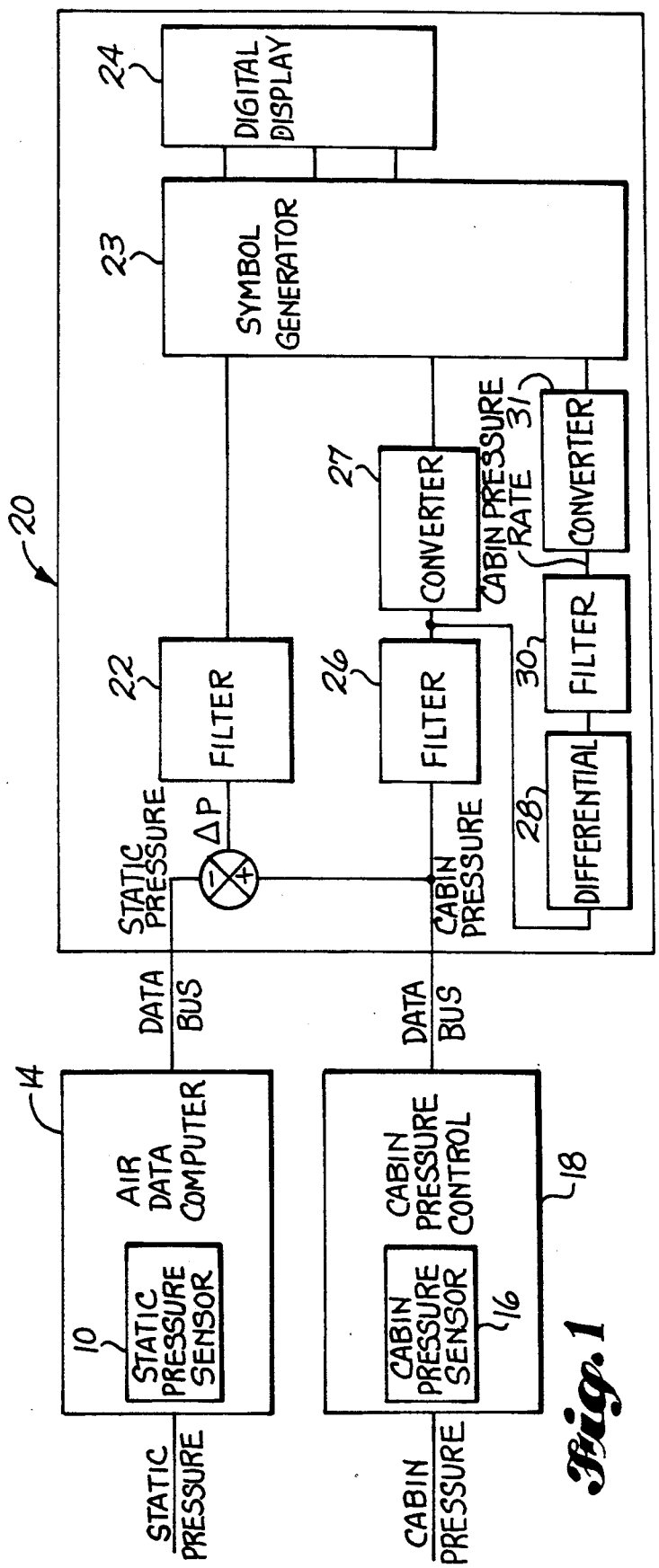
FIG. 1 is a block diagram of an exemplary system, which includes the digital filter of the present invention, for measuring and displaying cabin altitude, rate of change of cabin altitude, and a differential between cabin pressure and static pressure.

In an exemplary embodiment of the present invention reference is made to FIG. 1 which illustrates a system for measuring cabin pressure and ambient pressure and for using these measurements to display cabin altitude, cabin altitude rate, and a pressure differential between cabin pressure and static pressure. By way of background, in commercial jet aircraft the cabin is pressurized to maintain a habitable environment for the passengers and crew. Typically an aircraft flying at thirty five thousand feet will be pressurized to a cabin altitude of about eight thousand feet. It is desirable to display cabin altitude to allow the crew to monitor the cabin pressurization system. In a rapid descent, the aircraft altitude may change several thousand feet per minute, however the cabin pressure is regulated so that it changes at a rate of only a few hundred feet per minute. To allow the pilot to monitor cabin altitude rate, it also is displayed.

Figure 2:
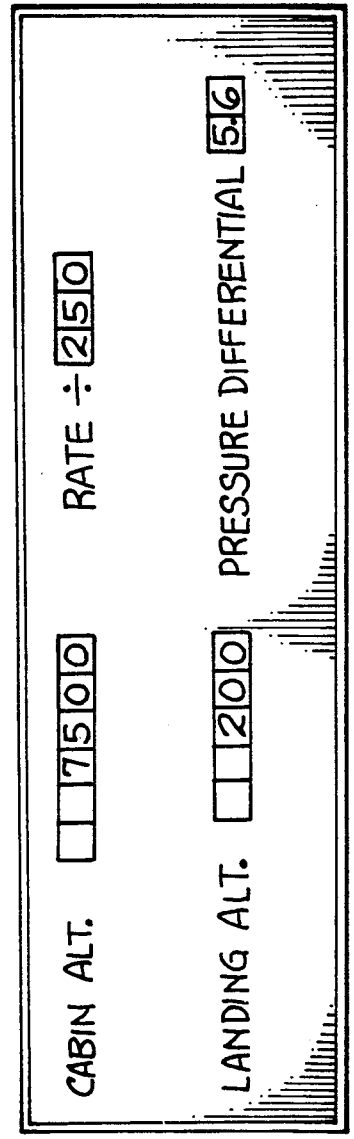
FIG. 2 is a diagram of an exemplary cockpit display showing cabin altitude, cabin altitude rate, cabin pressure differential, and landing altitude.

The exemplary system shown in FIG. 1 includes a sensor 10 which measures aircraft ambient (static) pressure. The sensor 10, which is part of a conventional air data computer 14, generates a digital static pressure output signal. Inside the aircraft cabin, cabin pressure is measured by a sensor 16. The sensor 16 is part of a cabin pressure controller 18 which generates a digital cabin pressure output signal. These signals are transmitted to an integrated display system (IDS) indicated at 20. The IDS 20, portions of which are shown in FIG. 1, in an exemplary embodiment is the Integrated Display System aboard the Boeing 747-400 aircraft. The IDS 20 includes a main processor, a memory (both not shown), as well as a subtractor 21 which subtracts the static pressure signal from the cabin pressure signal to generate a pressure difference signal ($\Delta P$). The pressure difference signal is fed downstream to a unique filter 22 which will be described in greater detail hereinafter. The filtered signal is then fed to a conventional symbol generator 23 for displaying the cabin differential pressure at a conventional CRT display screen 24. The display is shown in greater detail in FIG. 2.

The cabin pressure signal is also fed to a unique filter 26 which will be described in greater detail hereinafter. The filtered cabin pressure signal is converted to a cabin altitude signal at a converter 27. The filtered cabin altitude signal is then fed to the symbol generator 23 for displaying the cabin altitude at the display 24.

In order to display the rate of change of cabin altitude (cabin altitude rate), the filtered cabin pressure signal is differentiated by a conventional differentiator 28 to generate a cabin pressure rate signal which is filtered by a unique downstream filter 30 which also is to be described in further detail hereinafter. The filtered cabin pressure rate signal is fed to a converter 31 for converting cabin pressure rate to cabin altitude rate. The cabin altitude rate signal is fed to the symbol generator 23 for displaying the cabin altitude rate at the display screen 24. In a further exemplary embodiment, those of the aforementioned components which are conventional are used aboard the Boeing 747-400 aircraft.

In the present embodiment, the filters 22, 26, 30 are exponential infinite impulse response filters which are implemented in a conventional EFIS/EICAS interface unit (EIU) such as the EIU aboard the Boeing 747-400 aircraft.

Each of these filters is a variable time constant filter. The time constants of the variable time constant filters are a direct function of the magnitude of the rate of change of the input signal S. That is, when there is a large step input or a rapidly changing signal, the time constants of the filters are shortened. On the other hand, if a small step input is present or there is a slowly changing signal, then the time constants of the filters are increased. In this manner the unwanted noise is removed from the signal while providing a smoothly changing output for driving the display.

Figure 3:
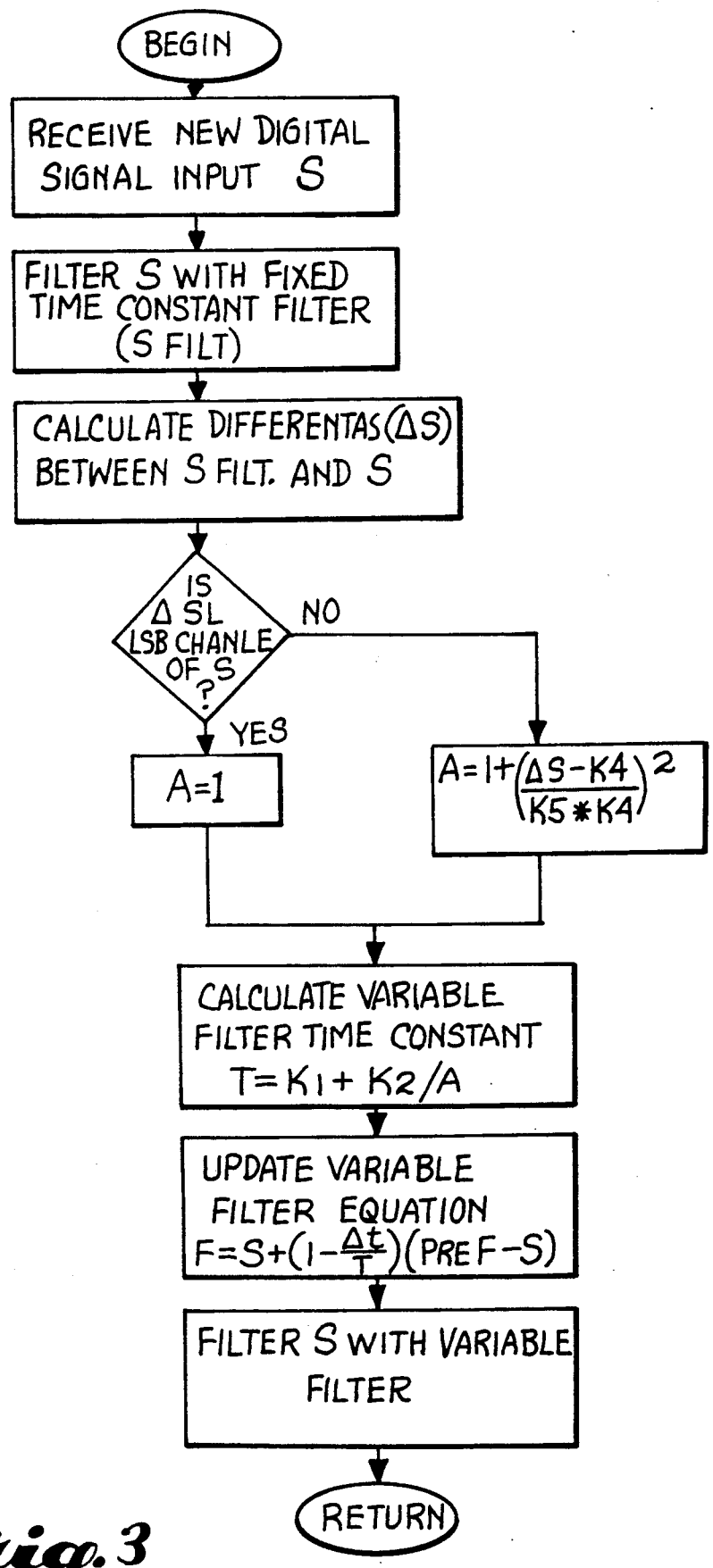
FIG. 3 is a simplified flow chart describing an exemplary embodiment of the digital filter of the present invention.
Figure 4:
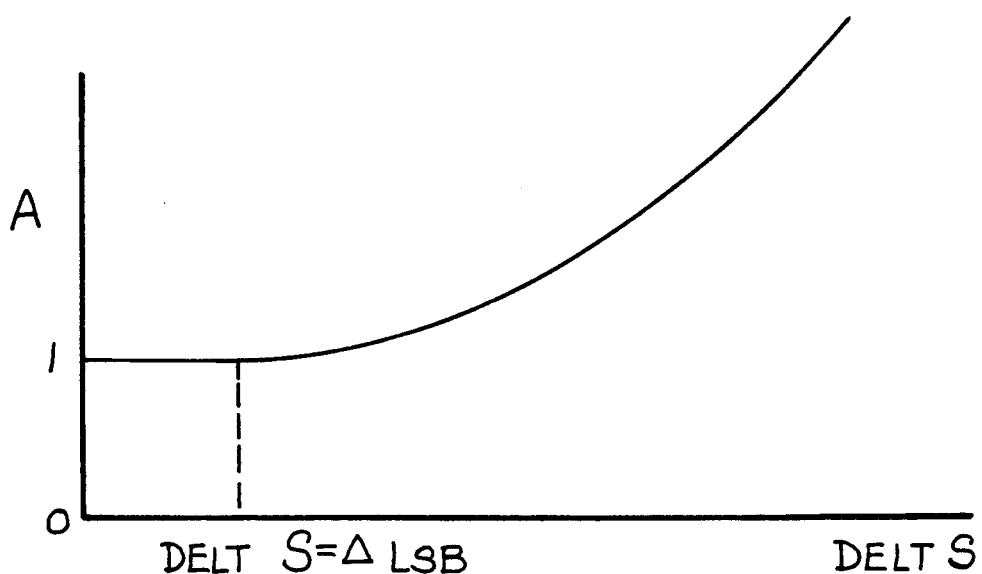
FIG. 4 is a graph of variable "A" as a function of a variable Delts.

Implementation of the filters is described in further detail by referring to the flowchart in FIG. 3. However, for purposes of explanation, the description of the filtering operation will not follow the order of the flowchart. In the present exemplary embodiment, each filter has at least one variable time constant stage, and in a preferred embodiment each filter 22, 26, 30 has three cascaded variable time constant stages. Each variable time constant stage is described by the transfer function of a first approximation of a simple first order exponential filter F, $$F = S + (1 - \Delta t/T)(\text{Pref} - S) \quad (1),$$

where S is the input signal value, e.g. cabin pressure or ambient pressure from the sensors, PreF is a filtered output F from the immediately prior computation cycle of Equation 1, $\Delta t$ is the computation cycle time, and T is the filter time constant. The term "computation cycle time ($\Delta t$)" is defined as the time between successive computations of the filtered value. In the exemplary embodiment, the IDS 20 performs the filtering computations, stores these computations in memory, and then performs other tasks assigned to it before returning to compute another filtered value of the input signal S. The filter computation cycle time need not be the same as the computation cycle time of the main processor of the IDS 20. Where filter response requirements are slower than this, the filter computations may be divided into two or more segments so that the segments are computed in successive computation cycles of the main processor. In this manner the computation load per cycle of the main processor is reduced.

The filter time constant T is expressed by the equation $$T = K1 + K2A \text{ (seconds)} \quad (2),$$

where K1 is a selected minimum value of the time constant, the sum K1+K2 is a selected maximum value of the time constant, and A is value which adjusts the time constant in a range between its minimum and maximum values. The variable A is a direct function of the rate of change of the input signal.

In the exemplary embodiment where a three stage variable time constant filter is used, the value of K1 is selected to be greater than twice the computation cycle time; and preferably the value of K1 is selected to be three times the computation cycle time. This avoids the aliasing of signal fluctuations through the filters in accordance with Nyquist stability criterion.

In this exemplary embodiment, the value of the sum K1+K2 is chosen to be greater than one-third the time interval between successive changes of the digital value of the input S at the minimum rate of change for which smooth response is required. In the present embodiment, cabin altitude rates are generally between one hundred and one thousand feet per minute; however some flight conditions may generate higher rates. The present values of K1+K2 provide signal smoothing down to about forty feet per minute. At lower rates, the changes in input signal occur infrequently enough that the filtered rate value fluctuates. Since these lower rates occur as a transitory condition, the stability of the display is not affected.

The aforementioned exemplary value of K1+K2 assumes use of a three stage filter. For input changes occurring during a period which is similar to the filter's time constant, the filtering effect of additional filter stages is approximately additive. Therefore, a fewer number of filter stages requires a larger value of K1+K2, whereas a larger number of filter stages requires a smaller value of K1+K2. In addition, the time constant may be adjusted to meet smoothness requirements of specific applications, e.g. longer time constant for increased smoothness of the filtered signal If DeltS (defined below) is less than the rate of change of one least significant bit ($\Delta$LSB) of the digital value of the input signal, then the variable A=1. In other words, if the input signal S has its increments of change (changes of one LSB) occurring at intervals greater than the time constant of the fixed filter, the maximum time constant (K1+K2) is used in the variable filter. The value of DeltS is determined by initially filtering the input S with a fixed time constant filter (Sfilt), and then determining the absolute value of (S-Sfilt).

Figure 5:
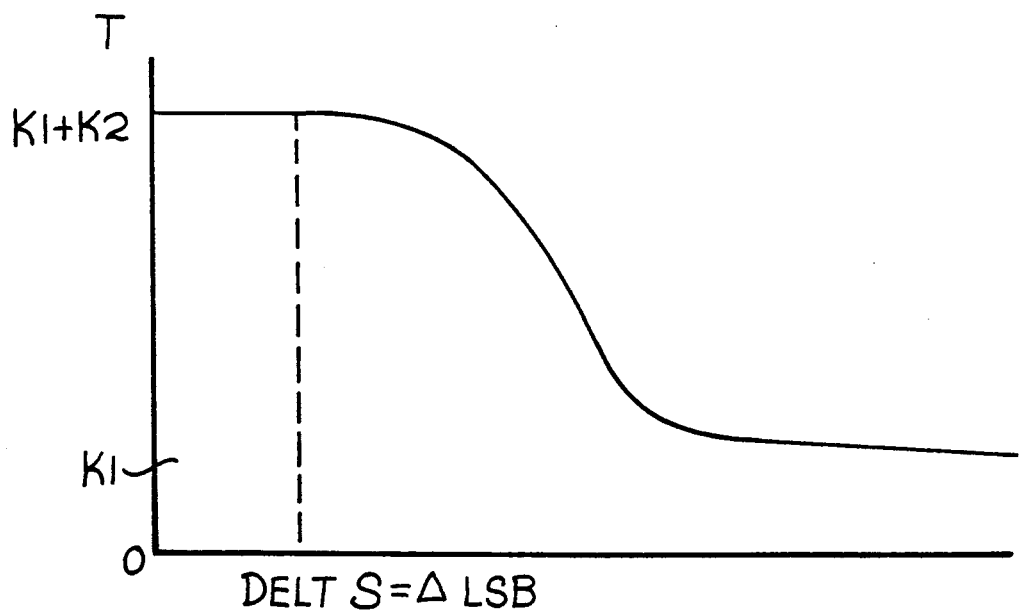
FIG. 5 is a graph of variable time constant "T" as a function of DeltS.

Otherwise, if DeltS is greater than or equal to $\Delta$LSB, then the value of A is determined by the equation $$A = 1 + [(\text{DeltS} - K4)/(K4 + K5)]^2 \quad (3)$$

where $K4 = \Delta LSB$ and K5 is a constant having a value which is selected to optimize filter response. This is reflected by a graph illustrated in FIG. 5 where time constant T is a function of DeltS. When DeltS is less than ΔLSB, then the variable time constant does not change. However when DeltS is greater than ΔLSB, it is desirable to generate time constant values which are adjusted downward in smaller increments for lower values of DeltS, and which are adjusted downward in larger increments for larger values of DeltS. Therefore, at DeltS values greater than ΔLSB, equation #3 describes a parabolic curve which satisfies the above mentioned criteria. Furthermore, at the "change point" where DeltS=ΔLSB, the straight line segment and the curved segments join so that there is a smooth transition therebetween. This provides for smooth and continuous operation of the filter. In this manner, T will eventually approach, but never reach, the value of K1 (the minimum filter constant value).

It has been found that a good initial value for K5 is six. For applications other than visual displays, system simulations and analysis may lead to other values as being optimum.

In an alternate embodiment the variable A is calculated in a different manner. That is, when DeltS is less than the sum of K4+K5, then A=1. Otherwise, when DeltS is greater than or equal to the sum of K4+K5, then $$A = (\text{DeltS} - K4)/K5 \quad (4),$$

where K4=ΔLSB and K5 is a selectable constant which may be initialized at one-fourth the value of K4. This embodiment provides a simpler method of calculating the value A and is preferable when signal processing must be done at high speed or when minimal computation capability is available.

By filtering the input with a filter having a known fixed time constant, a baseline or reference is generated from which the time constant of the variable filter can be adjusted. For example, if the input signal is changing in a manner that the difference between the input signal S and the fixed time constant filtered value of S (Sfilt) is more than one least significant bit of the digital input, then the time constant of the variable filter is shortened.

The fixed time constant filter has the transfer function $$\text{Sfilt} = S + e^{-\Delta t/K3}(\text{PreSfilt} - S) \quad (5),$$

where PreSfilt is the value of Sfilt from the previous computation cycle, and K3 is a constant which is typically equal to the sum K1+K2 and which can be adjusted to approximately equal to the maximum time constant of the variable time constant filter. This was found to be a good choice during simulations.

A typical method for optimizing constants for use in the filters is to run simulations for various types of inputs, beginning with baseline or rule-of-thumb values and performing successive simulations with alternate values for the constants. The best performance is selected based on review of the results, and the corresponding constants used for a new baseline for another set of simulations, with this process repeated until all results are acceptable.

In the aforementioned exemplary embodiment, an adaptive filter has been described for use with an cockpit display system. It should be appreciated the digital filter has applications to other systems such as robotics and flight controls where it is desirable to have the filter time constants at their maximum values for a slowly changing input signal, and at their minimum values for a rapidly changing input signal. The present filter accomplishes these functions while transitioning smoothly between these extremes.

It should be noted that for the filter to be effective, the filtered signal must have a greater number of data bits than that of the signal coming in. This allows the filtered signal to change in smaller increments than the incoming signal. For example, if the input signal has eight bit resolution and the processor also has eight bit resolution, operating the processor in double precision will provide signal processing at sixteen bit resolution. This will allow the filtered signal to change with eight more bits of resolution than the input signal, thereby providing much finer changes.

What is claimed is:

1. A method of filtering a digital signal having a minimum incremental change between digit values represented in the digital signal, the method comprising the steps of:
    a. receiving the digital signal;
    b. determining a change between digit values represented in the digital signal;
    c. filtering the digital signal using an adjusted time constant so as to generate a filtered output of the digital signal; and
    d. automatically adjusting the time constant of a filter so that as the change between the digit values represented in the digital signal (i) decreases, the filter time constant is increased in a manner to filter the digital signal for a greater period and in a manner to filter the digital signal for a period that is greater than a period between minimum incremental changes of the digit values represented in the digital signal, and (ii) increases, the filter time constant is decreased in a manner to filter the digital signal for a shorter period and in a manner to filter the digital signal for a period that is greater than the period between minimum incremental changes of the digit values represented in the digital signal.

2. The method as set forth in claim 1 wherein:
    a. the filtered digital signal is fed to a video display for generating a numerical display; and
    b. the filtered digital signal produces a smooth change between numbers of the numerical display.

3. A method as set forth in claim 1 wherein when the change in digit values represented in the digital signal is less than the minimum incremental change between digit values represented in the digital signal, the time constant is adjusted to a maximum value.

4. A method as set forth in claim 1 wherein the change in the digit values represented in the digital signal is determined by filtering the digital signal with a filter having a fixed time constant so as to establish a filtered reference signal, and then by subtracting the digital signal from the filtered reference signal to generate a delta value.

5. The method as set forth in claim 4 wherein:
    a. the filter time constant is unchanged when the delta value is less than the minimum incremental change between digit values represented in the digital signal; and
    b. the filter time constant is changed when the delta value is greater than the minimum incremental change between digit values represented in the digital signal.

6. The method as set forth in claim 4 wherein when the delta value is greater than the minimum incremental change between digit values represented in the digital signal, the filter time constant is adjusted in a manner that the time constant is decreased in smaller increments for smaller increases in the delta value, and the time constant is decreased in larger increments for larger increases in the delta value.

7. The method as set forth in claim 4 wherein the filter time constant is defined by the equation $T = K_1 + K_2 A$ where T is the filter time constant, $K_1$ is a constant which is equal to a selected minimum time constant for the filter, the sum $K_1 + K_2$ is equal to a selected maximum time constant for the filter, and A is a variable wherein $A = 1$ when the delta value is less than the minimum incremental change between the digit values represented in the digital signal, and wherein A is greater than 1 when the delta value is greater than the minimum incremental change between the digit values represented in the digital signal.

8. Visual display apparatus comprising:
   a. means for receiving a digital signal having a minimum incremental change between digit values represented in the digital signal;
   b. means for providing a visual display of display values generated by the digit values;
   c. means for determining a change between the digit values represented in the digital signal;
   d. means for filtering the digital signal; and
   e. means for automatically adjusting a time constant of the filtering means so that as the change in digit values represented in the digital signal (i) decreases, the filter time constant is increased in a manner to filter the digital signal for a greater period and in a manner to filter the digital signal for a period that is greater than a period between changes in digit values of the digital signal, and (ii) increases, the filter time constant is decreased in a manner to filter the digital signal for a shorter period and in a manner to filter the digital signal for a period that is greater than the period between changes of the digit values of the digital signal so as to generate a filtered output of the digital signal.

9. The apparatus as set forth in claim 8 wherein:
   a. the digital signal has a minimum incremental change between the digit values; and
   b. the time constant adjusting means includes means for adjusting the time constant so as to filter the digital signal for a period which includes more than one minimum incremental change between the digit values represented in the digital signal.

10. The apparatus as set forth in claim 8 wherein the time constant adjusting means includes means for adjusting the time constant so that when the change between digit values represented in the digital signal is less than the minimum incremental change between digit values represented in the digital signal, the time constant is set at a maximum value.

11. The apparatus as set forth in claim 8 wherein the time constant adjusting means includes means for adjusting the time constant so that the change between the digit values represented in the digital signal is determined by filtering the digital signal with a filter having a fixed time constant so as to establish a filtered reference signal, and then by subtracting the digital signal from the filtered reference signal to generate a delta value.

12. The apparatus as set forth in claim 11 wherein the time constant adjusting means includes:
   a. means for adjusting the time constant in a manner that the filter time constant is unchanged when the delta value is less than the minimum incremental change between digit values represented in the digital signal; and
   b. means for adjusting the time constant in a manner that the filter time constant is changed when the delta value is greater than the minimum incremental change between digit values represented in the digital signal.

13. The apparatus as set forth in claim 11 wherein the time constant adjusting means includes means for adjusting the time constant in a manner that when the delta value is greater than the minimum incremental change between digit values represented in the digital signal, the filter time constant is adjusted in a manner that the time constant decreases in smaller increments for smaller increases in the delta value, and the time constant decreases in larger increments for larger increases in the delta value.

14. The apparatus as set forth in claim 11 wherein the time constant adjusting means includes means for adjusting the time constant in a manner that the filter time constant is defined by the equation $T = K_1 + K_2/A$ where T is the filter time constant, $K_1$ is a constant which is equal to a selected minimum time constant for the filter, the sum $K_1 + K_2$ is equal to a selected maximum time constant for the filter, and A is a variable wherein $A = 1$ when the delta value is less than the minimum incremental change between the digit values represented in the digital signal, and wherein A is greater than 1 when the delta value is greater than the minimum incremental change between the digit values represented in the digital signal.

15. Apparatus for filtering a digital signal, the apparatus comprising:
   a. input means for receiving the digital signal;
   b. means for determining a change in digit values represented in the digital signal;
   c. means for filtering the digital signal using an adjusted time constant so as to generate a filtered output of the digital signal; and
   d. means for automatically adjusting the time constant so that as a change in digit values represented in the digital signal (i) decreases, the filter time constant is increased in a manner to filter the digital signal for a greater period and in a manner to filter the digital signal for a period that is greater than a period between changes in digit values of the digital signal, and (ii) increases, the filter time constant is decreased in a manner to filter the digital signal for a shorter period and in a manner to filter the digital signal for a shorter period that is greater than the period between changes in digit values of the digital signal.

16. The apparatus as set forth in claim 15 wherein:
   a. the digital signal has a minimum incremental change between the digit values represented in the digital signal; and
   b. the time constant adjusting means includes means for adjusting the time constant so as to filter the digital signal for a period that is greater than the period between changes of the digit values represented in the digital signal.

17. The apparatus as set forth in claim 16 wherein the time constant adjusting means includes means for adjusting the time constant so that when the change between digit values represented in the digital signal is less than the minimum incremental change between digit values represented in the digital signal, the time constant is set at a maximum value.

18. The apparatus as set forth in claim 16 wherein the time constant adjusting means includes means for adjusting the time constant so that the change in the digit values represented in the digital signal is determined by filtering the digital signal with a filter having a fixed time constant so as to establish a filtered reference signal, and then by subtracting the digital signal from the filtered reference signal to generate a delta value.

19. The apparatus as set forth in claim 18 wherein the time constant adjusting means includes:
   a. means for adjusting the time constant in a manner that the filter time constant is unchanged when the delta value is less than the minimum incremental change between digit values represented in the digital signal; and
   b. means for adjusting the time constant in a manner that the filter time constant is changed when the delta value is greater than the minimum incremental change between digit values represented in the digital signal.

20. The apparatus as set forth in claim 18 wherein the time constant adjusting means includes means for adjusting the time constant in a manner that when the delta value is greater than the minimum incremental change between digit values represented in the digital signal, the filter time constant is adjusted in a manner that the time constant decreases in smaller increments for smaller increases in the delta value, and the time constant decreases in larger increments for larger increases in the delta value.

21. The apparatus as set forth in claim 18 wherein the constant adjusting means includes means for adjusting the time constant in a manner that the filter time constant is defined by the equation $T = K_1 + K_2/A$ where T is the filter time constant, $K_1$ is a constant which is equal to a selected minimum time constant for the filter, the sum $K_1 30 K_2$ is equal to a selected maximum time constant for the filter, and A is a variable wherein $A = 1$ when the delta value is less than the minimum incremental change between the digit values represented in the digital signal, and wherein A is greater than 1 when the delta value is greater than the minimum incremental change between digit values represented in the digital signal.

22. A method of filtering a digital signal having a minimum incremental change between digit values represented in the digital signal, the method comprising the steps of:
   a. receiving the digital signal containing a noise component;
   b. determining a change between digit values represented in the digital signal;
   c. removing the noise component from the digital signal by filtering the digital signal using an adjusted time constant so as to generate a filtered output of the digital signal; and
   d. automatically adjusting the time constant of the filtering step when removing the noise component so that as the change between digit values represented in the digital signal (i) decreases, the filter time constant is increased in a manner to filter the digital signal for a greater period and in a manner to filter the digital signal for a period that is greater than a period between minimum incremental changes of the digit values represented in the digital signal, and (ii) increases, the filter time constant is decreased in a manner to filter the digital signal for a shorter period and in a manner to filter the digital signal for a period that is greater than the period between minimum incremental changes of the digit values represented in the digital signal.

23. A visual display apparatus comprising:
   a. means for receiving a digital signal containing a noise component and having a minimum incremental change between digit values represented in the digital signal;
   b. means for providing a visual display of display values generated by the digit values;
   c. means for determining a change between the digit values represented in the digital signal;
   d. means for performing a filtering operation to remove the noise component from the digital signal; and
   e. means for automatically adjusting a time constant of the filtering means when removing the noise component so that as the change in digit values represented in the digital signal (i) decreases, the filter time constant is increased in a manner to filter the digital signal for a greater period and in a manner to filter the digital signal for a period that is greater than a period between changes in digit values of the digital signal, and (ii) increases, the filter time constant is decreased in a manner to filter the digital signal for a shorter period and in a manner to filter the digital signal for a period that is greater than the period between changes of the digit values of the digital signal so as to generate a filtered output of the digital signal.

24. Apparatus for filtering a digital signal, the apparatus comprising:
   a. input means for receiving the digital signal containing a noise component;
   b. means for determining a change in digital values represented in the digital signal;
   c. means for removing the noise component from the digital signal by filtering the digital signal using an adjusted time constant; and
   d. means for automatically adjusting the time constant when removing the noise component so that as a change in digit values represented in the digital signal (i) decreases, the filter time constant is increased in a manner to filter the digital signal for a greater period and in a manner to filter the digital signal for a period that is greater than a period between changes in digit values of the digital signal, and (ii) increases, the filter time constant is decreased in a manner to filter the digital signal for a shorter period and in a manner to filter the digital signal for a period that is greater than the period between changes in digit values of the digital signal.

* * * * *